United States Patent
Wan et al.

(10) Patent No.: US 8,466,402 B2
(45) Date of Patent: Jun. 18, 2013

(54) IMAGING PIXELS WITH SHIELDED FLOATING DIFFUSIONS

(75) Inventors: Chung Chun Wan, Fremont, CA (US); Xiangli Li, San Jose, CA (US)

(73) Assignee: Aptina Imaging Corporation, George Town (KY)

( * ) Notice: Subject to any disclaimer, the term of this patent is extended or adjusted under 35 U.S.C. 154(b) by 332 days.

(21) Appl. No.: 12/911,702

(22) Filed: Oct. 25, 2010

(65) Prior Publication Data

US 2012/0097842 A1    Apr. 26, 2012

(51) Int. Cl.
*H01L 27/00* (2006.01)

(52) U.S. Cl.
USPC ............ 250/208.1; 250/214.1; 348/308; 257/448; 257/E27.131

(58) Field of Classification Search
USPC ............ 250/208.1, 214.1; 348/294, 302, 348/305, 308; 257/291, 292, 443, 448, E27.131, 257/E27.133
See application file for complete search history.

(56) References Cited

U.S. PATENT DOCUMENTS

| | | | |
|---|---|---|---|
| 5,986,297 A | 11/1999 | Guidash et al. | |
| 6,166,768 A | 12/2000 | Fossum et al. | |
| 6,307,195 B1 | 10/2001 | Guidash | |
| 6,680,498 B2 | 1/2004 | Guidash | |
| 2006/0043440 A1* | 3/2006 | Hiyama et al. | 257/291 |
| 2006/0044434 A1* | 3/2006 | Okita et al. | 348/294 |

* cited by examiner

*Primary Examiner* — Kevin Pyo
(74) *Attorney, Agent, or Firm* — Treyz Law Group; David C. Kellogg

(57) ABSTRACT

An imaging system may include imaging pixels. Each imaging pixel may include floating diffusion metal lines associated with a floating diffusion node in that imaging pixel, pixel output metal lines associated with a pixel output, and additional metal lines. The floating diffusion metal lines node may be at least partially surrounded by the pixel output metal lines. Because the floating diffusion metal lines are at least partially surrounded by the pixel output metal lines, the parasitic capacitance between the floating diffusion metal lines and the additional metal lines may be reduced. A source-follower transistor in each imaging pixel may provide a gain between the floating diffusion metal lines and the pixel output metal lines. Due to the Miller effect, the gain induced by the source-follower transistor may reduce the parasitic capacitance between the floating diffusion metal lines and the pixel output metal lines.

19 Claims, 6 Drawing Sheets

IMAGING PIXELS WITH SHIELDED FLOATING DIFFUSIONS

BACKGROUND

This relates to imaging systems and, more particularly, to imaging pixels with shielded floating diffusions nodes.

Modern electronic devices such as cellular telephones, cameras, and computers often use digital image sensors. Imagers (i.e., image sensors) may be formed from a two-dimensional array of image sensing pixels. Each pixel receives incident photons (light) and converts the photons into electrical signals. Image sensors are sometimes designed to provide images to electronic devices using a Joint Photographic Experts Group (JPEG) format.

With typical image sensing pixels, metal lines associated with floating diffusion nodes form parasitic capacitances with other metal lines in the pixels. These parasitic capacitances increase the overall capacitance of the floating diffusion nodes, thereby decreasing the pixel conversion gain of the pixels and reducing the sensitivity of the pixels to incident light.

It would therefore be desirable to provide improved imaging pixels with floating diffusion nodes with reduced parasitic capacitances.

DETAILED DESCRIPTION

Figure 1:
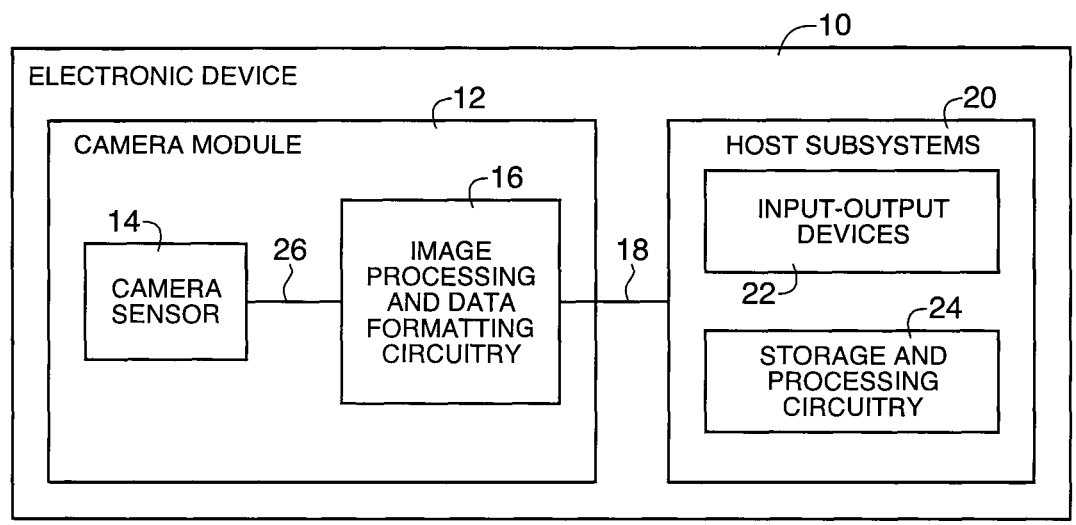
FIG. 1 is a diagram of an illustrative electronic device that may include an imager that includes imaging pixels with shielded floating diffusion storage nodes in accordance with an embodiment of the present invention.

An electronic device with a digital camera module is shown in FIG. 1. Electronic device 10 may be a digital camera, a computer, a cellular telephone, a medical device, or other electronic device. Camera module 12 may include image sensor 14 and one or more lenses. During operation, the lenses focus light onto image sensor 14. Image sensor 14 includes photosensitive elements (i.e., pixels) that convert the light into digital data. Image sensors may have any number of pixels (e.g., hundreds, thousands, millions, or more). A typical image sensor may, for example, have millions of pixels (e.g., megapixels). As examples, image sensor 14 may include bias circuitry (e.g., source follower load circuits), sample and hold circuitry, correlated double sampling (CDS) circuitry, amplifier circuitry, analog-to-digital (ADC) converter circuitry, data output circuitry, memory (e.g., buffer circuitry), address circuitry, etc.

Still and video image data from camera sensor 14 may be provided to image processing and data formatting circuitry 16 via path 26. Image processing and data formatting circuitry 16 may be used to perform image processing functions such as data formatting, adjusting white balance and exposure, implementing video image stabilization, face detection, etc. Image processing and data formatting circuitry 16 may also be used to compress raw camera image files if desired (e.g., to Joint Photographic Experts Group or JPEG format). In a typical arrangement, which is sometimes referred to as a system on chip or SOC arrangement, camera sensor 14 and image processing and data formatting circuitry 16 are implemented on a common integrated circuit. The use of a single integrated circuit to implement camera sensor 14 and image processing and data formatting circuitry 16 can help to minimize costs.

Camera module 12 (e.g., image processing and data formatting circuitry 16) conveys acquired image data to host subsystem 20 over path 18. Electronic device 10 typically provides a user with numerous high-level functions. In a computer or advanced cellular telephone, for example, a user may be provided with the ability to run user applications. To implement these functions, host subsystem 20 of electronic device 10 may have input-output devices 22 such as keypads, input-output ports, joysticks, and displays and storage and processing circuitry 24. Storage and processing circuitry 24 may include volatile and nonvolatile memory (e.g., random-access memory, flash memory, hard drives, solid state drives, etc.). Storage and processing circuitry 24 may also include microprocessors, microcontrollers, digital signal processors, application specific integrated circuits, etc.

Figure 2:
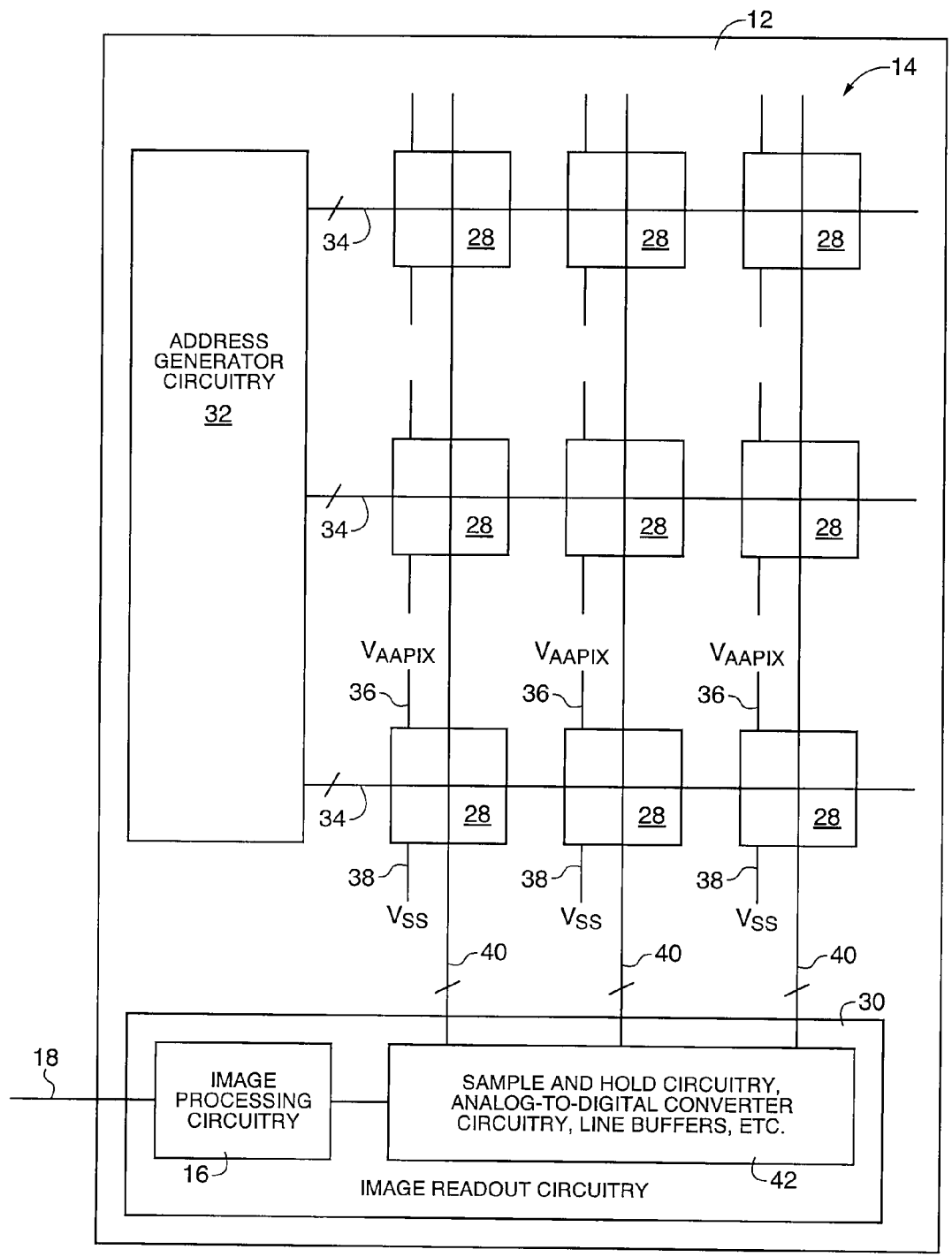
FIG. 2 is a diagram of an illustrative array of light-sensitive pixels and control circuitry coupled to the array of pixels in accordance with an embodiment of the present invention.

An example of an arrangement for sensor array 14 is shown in FIG. 2. As shown in FIG. 2, device 10 may include an array 14 of pixels 28 coupled to image readout circuitry 30 and address generator circuitry 32. As an example, each of the pixels in a row of array 14 may be coupled to address generator circuitry 32 by one or more conductive lines 34. Array 14 may have any number of rows and columns. In general, the size of array 14 and the number of rows and columns in array 14 will depend on the particular implementation. While rows and columns are generally described herein as being horizontal and vertical rows and columns may refer to any grid-like structure (e.g., features described herein as rows may be arranged vertically and features described herein as columns may be arranged horizontally).

Address generator circuitry 32 may generate signals on paths 34 as desired. For example, address generator circuitry 32 may generate reset signals on reset lines in paths 34, transfer signals on transfer lines in paths 34, and row select (e.g., row readout) signals on row select lines in paths 34 to control the operation of array 14. If desired, address generator circuitry 32 and array 14 may be integrated together in a single integrated circuit (as an example).

Image readout circuitry 30 may include circuitry 42 and image processing and data formatting circuitry 16. Circuitry 42 may include sample and hold circuitry, analog-to-digital converter circuitry, and line buffer circuitry (as examples). As one example, circuitry 42 may be used to measure signals in pixels 28 and may be used to buffer the signals while analog-to-digital converters in circuitry 42 convert the signals to digital signals. In a typical arrangement, circuitry 42 reads signals from rows of pixels 28 one row at a time over lines 40. The digital signals read out by circuitry 42 may be representative of charges accumulated by pixels 28 in response to incident light. The digital signals produced by the analog-to-digital converters of circuitry 42 may be conveyed to image processing and data formatting circuitry 16 and then to host subsystem 20 (FIG. 1) over path 18.

Figure 3:
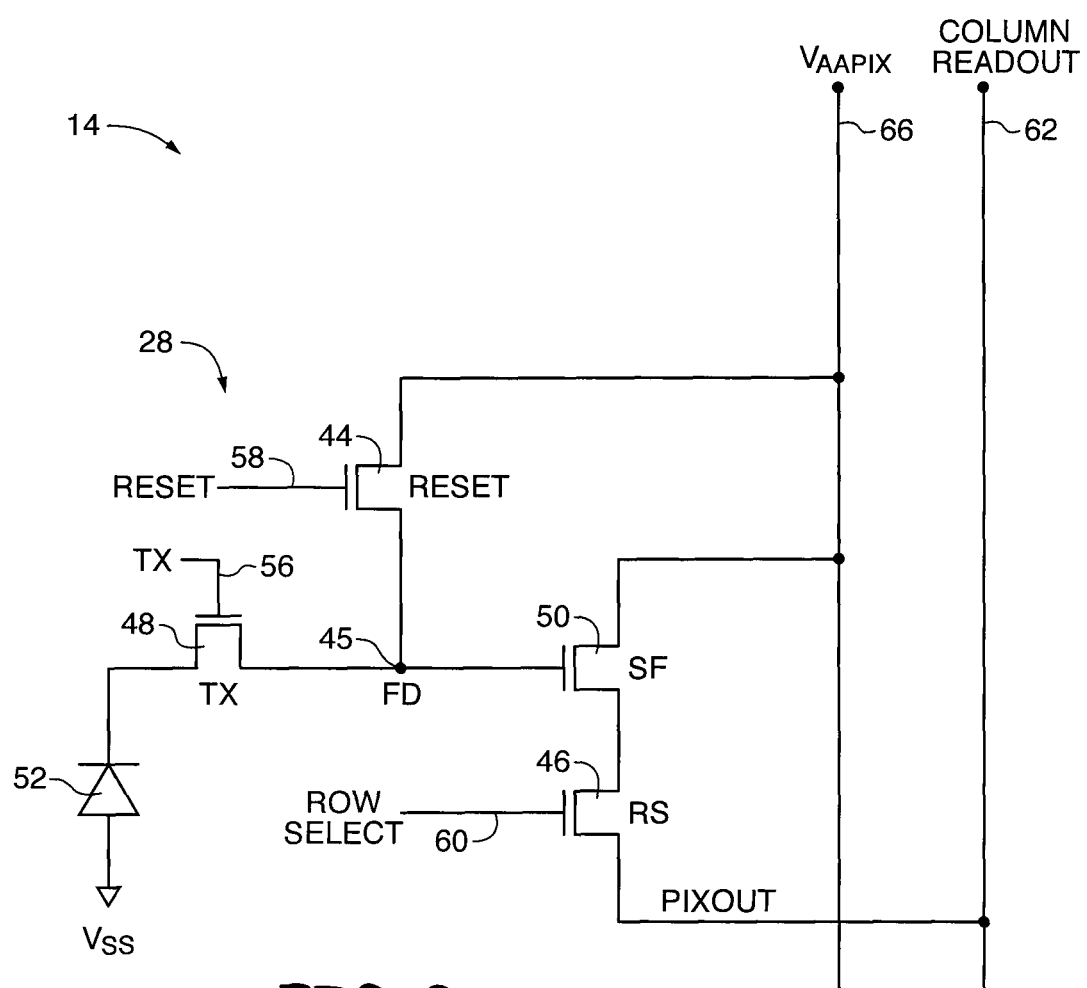
FIG. 3 is a diagram of an illustrative light-sensitive pixel that may include shield floating diffusion nodes in accordance with an embodiment of the present invention.

An example of an image sensing pixel that may be used in array 14 of FIG. 2 is shown in FIG. 3. As shown in FIG. 3, each pixel 28 of array 14 may include transistors such as reset transistor 44, row select transistor 46, transfer gate 48 (e.g., transfer transistor 48), and source-follower transistor 50 (e.g., a driver in pixel 28). Pixel 28 may include a photosensitive device such as photodiode 52 (sometimes referred to herein as a photosensitive element). In general, it is desirable to maximize the light collecting area of photosensitive device 52 relative to the total area of each pixel 28. This type of arrangement helps to maximize the sensitivity of each pixel 28 (and sensor 14) to incident light.

The photosensitive device in each pixel 28 of array 14 can accumulate charge in response to incident light (e.g., light which strikes photosensitive device 52). The time between a reset operation in which the accumulated charge is reset and a readout operation or a transfer operation (in which the accumulated charge is shifted to a storage element such as floating diffusion node FD) is sometimes referred to herein as an integration time or an exposure time. The accumulated charge generated by photosensitive device 52 may be proportional to the intensity of the incident light and the integration time. Relatively long integration times may be used to capture scenes with relatively low intensities (e.g., to ensure that the accumulated charge is sufficient to overcome noise in array 14) and relatively short integration times may be used to capture scenes with relatively high intensities (e.g., to ensure that the accumulated charge does not reach a saturation point).

Reset transistor 44 can be used to reset pixel 28. During reset operations, reset transistor 44 may be turned on by reset signals on reset line 58. When reset signals (RESET) on reset line 58 are asserted, transistor 44 may be turned on and may allow accumulated charge on floating diffusion node 45 to flow into a power supply line (e.g., through power supply terminal 66). In one embodiment, transfer signals (TX) on transfer line 56 may also be asserted during reset operations, such that the charges on both photosensitive element 52 and floating diffusion node 45 are reset.

Transfer gate 48 may be controlled by transfer line 56. When transfer signals (TX) on transfer line 56 are asserted, gate 48 may be turned on and may allow accumulated charge from photodiode 52 to flow to other transistors in pixel 28 or to a storage element such as floating diffusion node 45. Reset transistor 44 may be turned on when transfer gate 48 is turned on so that the accumulated charge from photodiode 52 flows to line 66. Transfer gate 48 may be turned on prior to a readout operation to allow the accumulated charge from photodiode 52 to flow to floating diffusion node 45. Transfer gate 48 may be turned on during a readout operation to allow the accumulated charge from photodiode 52 to flow to the gate of source-follower transistor 50.

Source-follower transistor 50 and row select transistor 46 may be used during a readout operation of pixel 28. Row select transistor 46 may be controlled by row select (ROW SELECT) signals on line 60. Source-follower transistor 50 may be coupled between a power supply line such as line 66 and row select transistor 46. Source-follower transistor 50 may be controlled by the accumulated charge generated by the photodiode 52 (which may be stored in diffusion node 45). When row select signals on line 60 are asserted, transistor 46 may be turned on, while the accumulated charge transferred from the photodiode 52 is used to control transistor 50. The voltage that the accumulated charge applies to the gate of transistor 50 determines the voltage of column readout (COULUMN READOUT) line 62. Image readout circuitry 30 of FIG. 2 may then determine the voltage of the accumulated charge in pixel 28 by sampling the voltage of line 62. If desired, image readout circuitry 30 may utilize a correlated double sampling technique in which the reset level of pixel 28 is also measured and the reset level is subtracted from the image signal level (e.g., the voltage of the accumulated charge in pixel 28).

With imaging pixel arrangements of the type shown in FIG. 3 and with other arrangements, the storage capacity or capacitance of floating diffusion nodes 45 may influence imaging performance. In particular, the storage capacity of floating diffusion nodes 45 (e.g., the electrostatic capacitance associated with nodes 45) influences the imaging sensitivity of pixels 28 (e.g., the charge detection sensitivity or conversion gain of pixels 28). It may be desirable to reduce the capacitance of diffusion nodes 45 in order to increase the conversion gain of pixels 28 in camera sensor 12. Increased conversion gain in pixels 28 will provide camera sensor 12 with increased sensitivity to light (e.g., increased low-light performance).

The capacitance of floating diffusion nodes 45 includes device capacitances associated with floating diffusion nodes 45 and parasitic metal capacitances. The parasitic metal capacitances may be between metal lines associated with floating diffusion nodes 45 (e.g., metal lines connecting node 45 to reset transistor 44, metal lines connecting node 45 to source-follower transistor 60, metal lines connecting node 45 to transfer gate 48, etc.) and other metal lines in pixels 28. As the size of individual pixels 28 is reduced, the device capacitance of nodes 45 decreases and the density of metal lines in pixels 28 increases (e.g., the parasitic capacitances associated with floating diffusion nodes 45 increases). In relatively small pixels 28, the parasitic capacitances may be the dominant contribution to the overall capacitance of floating diffusion nodes 45. As a consequence of these and other factors, it may be desirable to route metal lines in pixels 28 in a way that reduces or minimizes the parasitic capacitances associated with floating diffusion nodes 45 (e.g., to reduce the overall capacitance associated with floating diffusion nodes 45) to improve the conversion gain of pixel 28.

The Miller effect may be utilized to reduce the capacitance associated with floating diffusion node 45. In particular, a parasitic capacitance between floating diffusion node 45 and pixel output line (PIXOUT) between node 45 and column readout line 62 may be utilized to create a Miller effect that reduces the effective capacitance associated with node 45.

Figure 4A:
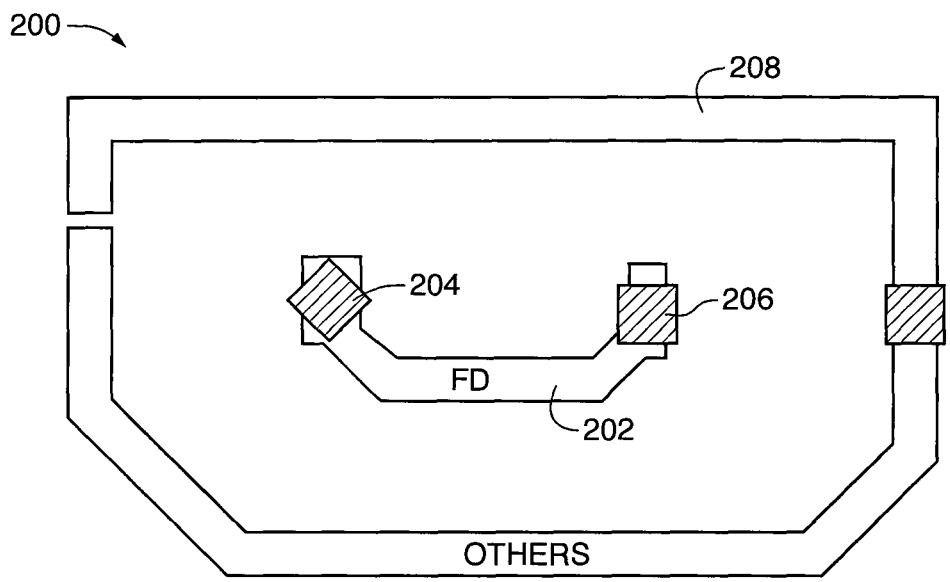
FIG. 4A is a diagram of metal lines and conductive terminals in a conventional imaging pixel.

A layout of metal lines and conductive terminals in a conventional imaging pixel 200 is shown in FIG. 4A. As shown in FIG. 4A, metal lines 202 associated with a floating diffusion node may be surrounded by other metal lines 208 in the pixel 200. Metal lines 202 associated with the floating diffusion node may connect terminal 204 to terminal 206. Terminal 204 may be connected to the floating diffusion node and terminal 206 may be connected to the gate of a source-follower transistor in pixel 200. The capacitance between metal lines 202 and metal lines 208 increases the total capacitance of the floating diffusion node of pixel 200, thereby decreasing the conversion gain and sensitivity of pixel 200.

Figure 4B:
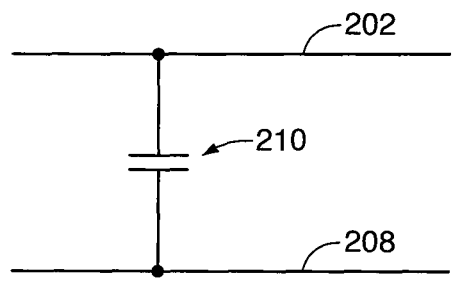
FIG. 4B is a diagram of parasitic capacitances between the metal lines of FIG. 4A.

The parasitic capacitance between metal lines 202 and 208 of FIG. 4A are shown in FIG. 4B. As shown in FIG. 4B, parasitic capacitance 210 forms between metal lines 202 and 208. The parasitic capacitance 210 increases the overall capacitance associated with the floating diffusion node of pixel 200, thereby reducing the pixel convention gain and sensitivity of conventional pixel 200. As one example, the parasitic capacitance 210 may be approximately 0.15 femtofarads.

Figure 5A:
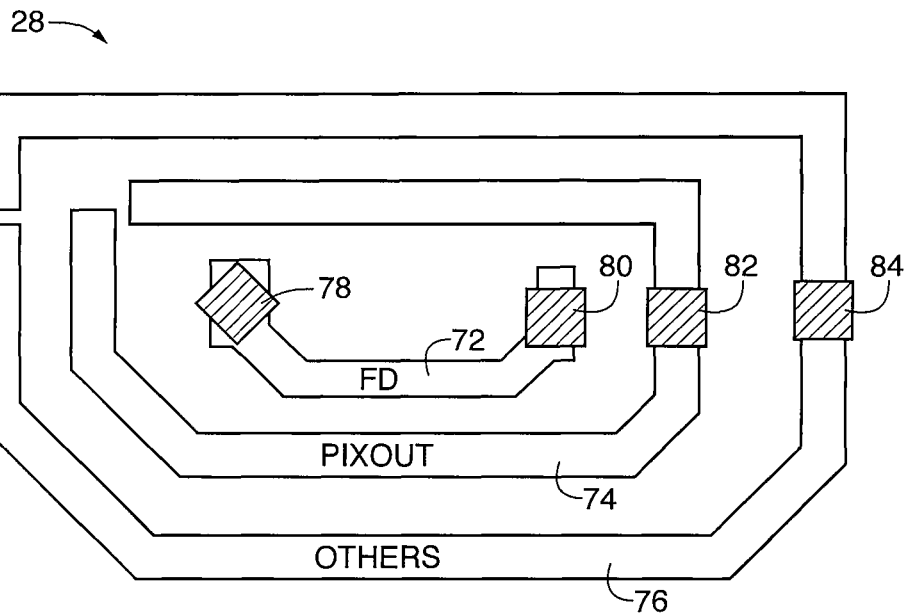
FIG. 5A is a diagram of illustrative metal lines and conductive terminals in an imaging pixel that may be arranged to electrically shield metal lines associated with a floating diffusion node in the imaging pixel in accordance with an embodiment of the present invention.

As shown in FIG. 5A, imaging pixel 28 may include metal lines 72 associated with floating diffusion node 45, metal lines 74 associated with pixel output line PIXOUT, and metal lines 76 associated with other lines in pixels 28 (e.g., reset line 58, transfer line 56, row select line 60, and other lines in pixels 28). Metal lines 72 may connect terminal 78 to terminal 80. Terminal 78 may be connected to floating diffusion node 45 and terminal 80 may be connected to the gate of source-follower transistor 50, as examples. Metal lines 74 may connect terminal 82 to other terminals (not shown). Terminal 82 may be a source-drain terminal of source-follower transistor 50 (e.g., the source terminal of transistor 50) or may be a source-drain terminal of row-select transistor 46 (e.g., the source terminal of transistor 46), as examples. Metal lines 76 may connect terminal 84 to other terminals (not shown). Terminal 84 may be, as examples, a terminal connected to reset transistor 44, transfer gate 48, photosensitive element 52, row-select transistor 46, source-follower transistor 50, another element in pixels 28, etc.

Some of all of the metal lines 72 associated with floating diffusion node 45 may be at least partially surrounded by some or all of the metal lines 74 associated with pixel output line PIXOUT. With this type of arrangement, the parasitic capacitance between metal lines 72 and metal lines 76 is reduced (e.g., relative to conventional arrangements such as the arrangement of FIG. 4A). This reduction in parasitic capacitance is easily understood in light of the well known example of a Faraday cage. However, this arrangement introduces a new additional and larger parasitic capacitance between metal lines 72 and metal lines 74. If no other effects are taken into account, the additional parasitic capacitance between floating diffusion metal lines 72 and PIXOUT metal lines 74 may outweigh the reduction in parasitic capacitance between metal lines 72 and metal lines 76 (e.g., the overall parasitic capacitance associated with metal lines 72 may not be reduced, if no other effects are taken into account).

Figure 5B:
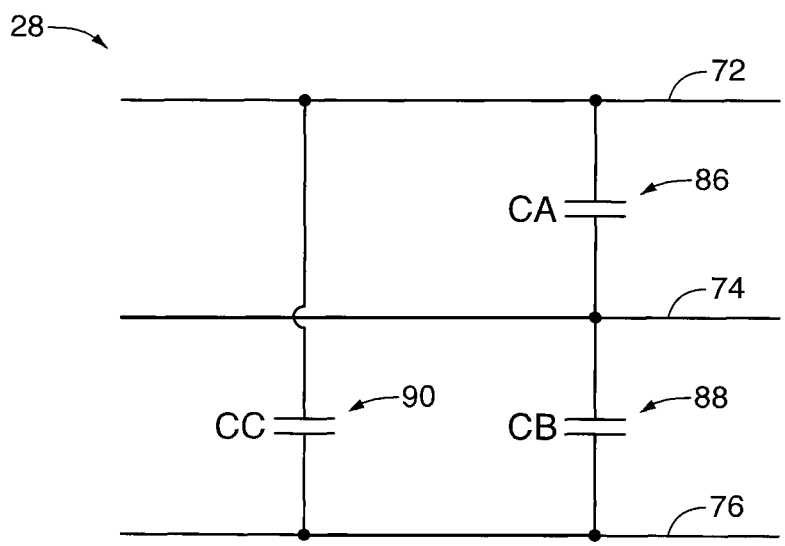
FIG. 5B is a diagram of illustrative parasitic capacitances that may form between metal lines in the imaging pixel of FIG. 5A in accordance with an embodiment of the present invention.

The parasitic capacitances between metal lines 72, 74, and 76 are shown in FIG. 5B. As shown in FIG. 5B, parasitic capacitance 86 (i.e., capacitance CA) may form between metal lines 72 and metal lines 74, parasitic capacitance 88 (i.e., capacitance CB) may form between metal lines 74 and metal lines 76, and parasitic capacitance 90 (i.e., capacitance CC) may form between metal lines 72 and metal lines 76. Parasitic capacitances 86 and 90 may each contribute to the overall capacitance of metal lines 72 and floating diffusion nodes 45. Due to the electrostatic shielding (e.g., the Faraday cage effect) provided by the physical arrangement of metal lines 72, 74, and 76 (see, e.g., FIGS. 5A and 6), parasitic capacitance 90 may be relatively small (e.g., in comparison to capacitance 86 and capacitance 210 of FIG. 4B).

The arrangement of FIGS. 5A and 5B may take advantage of the Miller effect to reduce the total parasitic capacitance associated with metal lines 72 and floating diffusion nodes 45 (e.g., relative to the total capacitance associated with metal lines 202 of conventional imaging pixel 200 of FIG. 4A). The Miller effect states that, if there is a gain A and a capacitance CA (i.e., capacitance 86) between metal lines 72 and metal lines 74, the effective capacitance associated with metal lines 72 becomes (1−A)*CA. As a result, the capacitance associated with metal lines 72 (and thereby the capacitance associated with floating diffusion nodes 45) can be significantly reduced if the gain A is close to one (unity). When applied to the arrangement of FIGS. 5A and 5B, the total capacitance associated with metal lines 72 may be equal to (CC+(1−A)*CA), which may be smaller than the capacitance 210 associated with metal lines 202 in the conventional arrangement of FIGS. 4A and 4B. The gain A may be developed between floating diffusion node 45 (e.g., which may be connected to metal lines 72) and the source-drain terminal of source-follower pixel 50 (i.e., which may be connected to metal lines 74). As one example, the gain between node 45 and PIXOUT (e.g., metal lines 72 and 74) may be approximately 0.8 to 0.85. With this arrangement, the effective capacitance associated with metal lines 72 (and induced by metal lines 74) is reduced by a multiplication factor of approximately 0.2 to 0.15. As a result, the total capacitance of floating diffusion nodes 45 may be reduced, relative to the conventional arrangements of FIGS. 4A and 4B.

As examples, capacitance 86 (CA) may be approximately 0.305 femtofarads and capacitance 90 (CC) may be approximately 0.0251 femtofarads. When the Miller effect is taken into account, the overall capacitance associated with metal lines 72 may be approximately 0.0861 femtofarads, which is substantially less than in the conventional arrangement of FIGS. 4A and 4B (e.g., 0.15 femtofarads).

Figure 6:
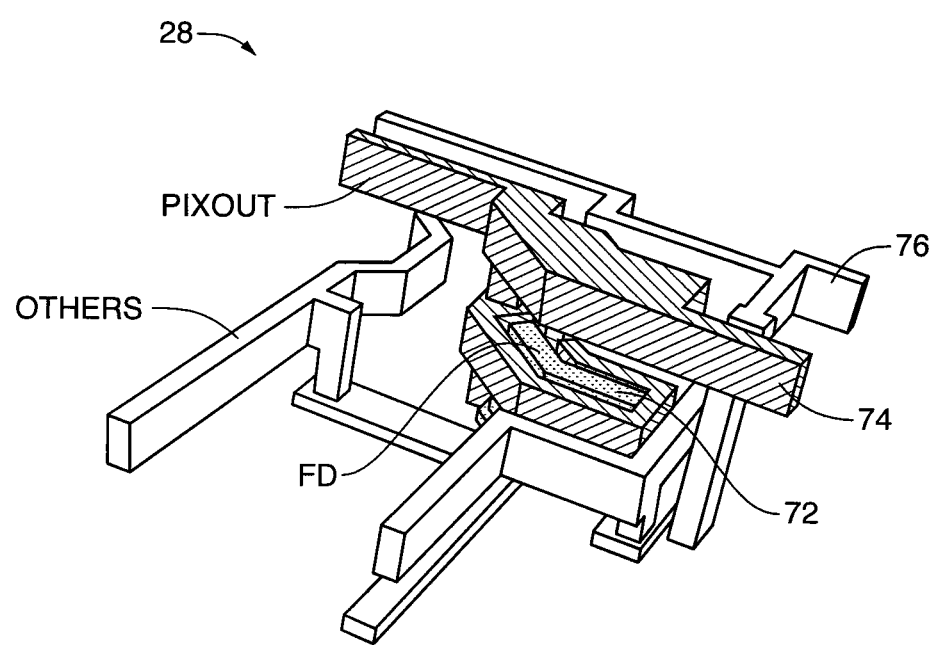
FIG. 6 is a diagram of the illustrative imaging pixel of FIGS. 5A and 5B showing a potential three-dimensional layout of the metal lines that may electrically shield metal lines associated with the floating diffusion node in the imaging pixel in accordance with an embodiment of the present invention.

FIG. 6 is a diagram of illustrative three-dimensional structures that may be used in implementing the arrangements described in connection with FIGS. 5A and 5B. As shown in FIG. 6, floating diffusion metal lines 72 may be at least partially surrounded (e.g., on multiple sides) by PIXOUT metal lines 74. PIXOUT metal lines 74 may be formed between floating diffusion metal lines 72 and additional metal lines 76 in imaging pixels 28.

Various embodiments have been described illustrating imaging pixels with shielded floating diffusions.

An imaging system may include imaging pixels. Each imaging pixel may include floating diffusion metal lines associated with a floating diffusion node in that imaging pixel, pixel output metal lines associated with a pixel output, and additional metal lines. The floating diffusion metal lines node may be at least partially surrounded by the pixel output metal lines. Because the floating diffusion metal lines are at least partially surrounded by the pixel output metal lines, the parasitic capacitance between the floating diffusion metal lines and the additional metal lines may be reduced. A source-follower transistor in each imaging pixel may provide a gain between the floating diffusion metal lines and the pixel output metal lines. Due to the Miller effect, the gain induced by the source-follower transistor may reduce the parasitic capacitance between the floating diffusion metal lines and the pixel output metal lines.

The foregoing is merely illustrative of the principles of this invention which can be practiced in other embodiments.

What is claimed is:

1. An image sensor comprising:
   an array of image sensing pixels, wherein each of the image sensing pixels comprises:
      a floating diffusion node;
      a source-follower transistor having a gate terminal;
      at least a first metal line that connects the floating diffusion node to the gate terminal of the source-follower transistor; and
      at least a second metal line that is connected to a pixel output line, wherein the second metal line substantially surrounds the first metal line.

2. The image sensor defined in claim 1 wherein the source-follower transistor forms a driver having a gain.

3. The image sensor defined in claim 1 wherein the source-follower transistor forms a driver having a gain that drives signals from the first metal line to the second metal line.

4. The image sensor defined in claim 3 wherein each of the image sensing pixels further comprises:
   at least a third metal line, wherein the second metal line is disposed between the third metal line and the first metal line.

5. The image sensor defined in claim 4 wherein the first metal line has a first parasitic capacitance formed by electrostatic interactions between the first metal line and the second metal line and a second parasitic capacitance formed by electrostatic interactions between the first metal line and the third metal line.

6. The image sensor defined in claim 5 wherein the second metal line electrostatically shields the first metal line from the third metal line and wherein the first parasitic capacitance is larger than the second parasitic capacitance.

7. The image sensor defined in claim 6 wherein the first parasitic capacitance of the first metal line is reduced, due to the Miller effect, by the driver that has the gain and that drives signals from the first metal line to the second metal line.

8. An image sensing pixel in an image sensor, the image sensing pixel comprising:
   a storage node;
   a transistor having a gate terminal;
   at least a first metal line that connects the storage node to the gate terminal of the transistor; and
   at least a second metal line that is connected to an output line, wherein the second metal line substantially surrounds the first metal line.

9. The image sensing pixel defined in claim 8 further comprising:
   at least a third metal line, wherein the second metal line is disposed between the third metal line and the first metal line.

10. The image sensing pixel defined in claim 9 wherein the first metal line has a first parasitic capacitance formed by electrostatic interactions between the first metal line and the second metal line and a second parasitic capacitance formed by electrostatic interactions between the first metal line and the third metal line.

11. The image sensing pixel defined in claim 10 wherein the second metal line electrostatically shields the first metal line from the third metal line and wherein the first parasitic capacitance is larger than the second parasitic capacitance.

12. The image sensing pixel defined in claim 11 wherein the transistor comprises a source-follower transistor.

13. The image sensing pixel defined in claim 11 wherein the transistor comprises a driver having a gain that drives signals from the first metal line to the second metal line.

14. The image sensing pixel defined in claim 13 wherein the first parasitic capacitance of the first metal line is reduced, due to the Miller effect, by the driver that has the gain and that drives signals from the first metal line to the second metal line.

15. An image sensing pixel in an image sensor, the image sensing pixel comprising:
   a storage node;
   a driver having an input terminal and having an output;
   at least a first metal line that couples the storage node to the input terminal of the driver; and
   at least a second metal line that is coupled to the output of the driver, wherein the second metal line substantially surrounds the first metal line, wherein the driver drives signals from the first metal line onto the second metal line with a gain, and wherein the first metal line has a first parasitic capacitance that is reduced because of the Miller effect induced by the gain between the first metal line and the second metal line.

16. The image sensing pixel defined in claim 15 further comprising:
   at least a third metal line, wherein the second metal line is disposed between the third metal line and the first metal line.

17. The image sensing pixel defined in claim 16 wherein the first parasitic capacitance is formed by electrostatic interactions between the first metal line and the second metal line and wherein the first metal line has a second parasitic capacitance formed by electrostatic interactions between the first metal line and the third metal line.

18. The image sensing pixel defined in claim 17 wherein the second metal line electrostatically shields the first metal line from the third metal line and wherein the first parasitic capacitance is larger than the second parasitic capacitance.

19. The image sensing pixel defined in claim 18 wherein the first parasitic capacitance of the first metal line is reduced, due to the Miller effect, by the driver that has the gain and that drives signals from the first metal line to the second metal line.

* * * * *